United States Patent
Minter et al.

(10) Patent No.: US 6,218,090 B1
(45) Date of Patent: Apr. 17, 2001

(54) METHOD OF CREATING CONTROLLED DISCONTINUITY BETWEEN PHOTORESIST AND SUBSTRATE FOR IMPROVING METAL LIFT OFF

(75) Inventors: Jason P. Minter; William R. Livesay, both of San Diego, CA (US)

(73) Assignee: Electron Vision Corporation, San Diego, CA (US)

(*) Notice: Subject to any disclaimer, the term of this patent is extended or adjusted under 35 U.S.C. 154(b) by 0 days.

(21) Appl. No.: 09/270,533

(22) Filed: Mar. 17, 1999

(51) Int. Cl.$^7$ .................................................. G03C 5/00
(52) U.S. Cl. .................... 430/394; 430/312; 430/313; 430/315; 430/296; 430/328; 430/942; 430/945; 430/967
(58) Field of Search .................... 430/296, 394, 430/312, 313, 315, 328, 942, 945, 967

(56) References Cited

U.S. PATENT DOCUMENTS

| | | | |
|---|---|---|---|
| 5,468,595 | 11/1995 | Livesay | 430/296 |
| 5,658,469 | 8/1997 | Jennison | 216/22 |
| 5,843,537 | 12/1998 | Kim et al. | 427/504 |
| 6,150,070 | * 11/2000 | Minter et al. | 430/296 |

* cited by examiner

*Primary Examiner*—Shean C. Wu
(74) *Attorney, Agent, or Firm*—Roberts & Mercanti LLP (57) ABSTRACT

A process for forming a photoresist image on a substrate and a process for forming metal contacts on a substrate are described. The process of forming a photoresist image includes depositing a positive working photoresist composition onto a metal layer which is on a substrate to thereby form a photoresist layer then imagewise exposing the photoresist layer to actinic radiation and developing said photoresist layer to form a plurality of cavities through the photoresist layer thereby revealing portions of the metal layer. Then the inventions provides for etching away the revealed portions of the metal layer followed by an overall exposing both the substrate and the remaining photoresist layer and remaining metal layer portions to sufficient electron beam radiation to render a part of the photoresist layer directly adjacent to the metal layer more soluble in a developer than the balance of the photoresist layer. Finally, the more soluble part of the photoresist layer is partially developed to thereby expand the cavities to form notches in the photoresist layer directly adjacent to the metal layer. In order to form the metal contacts of the present invention the invention provides for the further steps of depositing a metal into said cavities and notches to thereby form a conductive attachment to said metal contacts and removing the remaining photoresist and any metal which is not attachment-forming to thereby form metal contacts on the substrate. Microelectronic devices prepared by the same process are also disclosed.

27 Claims, 8 Drawing Sheets

METHOD OF CREATING CONTROLLED DISCONTINUITY BETWEEN PHOTORESIST AND SUBSTRATE FOR IMPROVING METAL LIFT OFF

BACKGROUND OF THE INVENTION

1. Field of the Invention

This invention relates generally to semiconductor devices. More specifically, the invention relates to the formation of submicron metal contacts on substrates.

2. Description of the Prior Art

The art of forming images for the production of microelectric devices is well known. In this regard, photoresist compositions are widely used image-forming compositions for microelectronic device manufacturing processes. Generally, in these processes a thin coating of a radiation sensitive photoresist composition is first applied to a substrate material. The coated substrate is then treated to evaporate any solvent in the photoresist composition and to fix the coating onto the substrate. The coated surface of the substrate is next subjected to an imagewise exposure to actinic radiation. This radiation exposure causes a chemical transformation in the exposed areas of the coated surface. Visible light, ultraviolet (UV) light, electron beam and X-ray radiant energy are radiation types commonly used in microlithographic processes. After imagewise exposure, the coated substrate is contacted with a developer solution to dissolve and remove either the radiation-exposed or the unexposed areas of the coated surface of the substrate.

There are two general categories of photoresist compositions—negative working and positive working photoresists. When negative working photoresist compositions are exposed imagewise to radiation, the areas exposed to radiation become less soluble to a developer solution while the unexposed areas of the photoresist coating remain relatively soluble to a developing solution. Thus, treatment of an exposed negative working resist with a developer causes removal of the non-exposed areas of the resist coating thereby uncovering a desired portion of the underlying substrate surface on which the photoresist composition was deposited. When positive working photoresist compositions are exposed imagewise to radiation, those areas exposed to the radiation become more soluble to the developer solution while unexposed areas remain relatively insoluble to the developer solution. Thus, treatment of an exposed positive working photoresist with the developer causes removal of the exposed areas of the resist coating and the creation of a positive image in the photoresist coating. A desired portion of the underlying substrate surface remains uncovered. Positive-working photoresist compositions are currently favored over negative-working resists because the former generally have better resolution capabilities and pattern transfer characteristics.

Imaging processes may be additive or subtractive in nature. Subtractive processes entail an etching away of material using dry plasma, a chemical solution, or an ion beam. In a subtractive process a substrate is coated with a resist and the resist layer is then imagewise exposed to radiation in order to degrade the resist in the exposed area. The resist is next immersed in a solvent, which dissolves away the exposed region, leaving the desired image. The resist layer then acts as a protective mask for the subsequent etching away of the material in the layer to be patterned. Remaining portions of the resist layer are then stripped away in a strong solvent, leaving the desired image. Additive processes are those where material is deposited after the resist has been patterned. In an additive or so called "lift-off" process, a metal is deposited after resist patterning and then the resist is stripped off, leaving metal in the open areas of the resist. In such a process, a substrate is coated with a resist layer which is then exposed and developed to dissolve away the exposed image areas. A metal or other material to be patterned is deposited on top of the resist layer, such that the metal or other material adheres to the substrate in the patterned regions. The resist layer is then removed and the excess metal sheared off leaving only a metal contact attached to the substrate.

One major drawback with the additive process, however, occurs when shearing the metal during lift-off in the final step. Using the conventional approach, excess metal located on top of the photoresist layer and along the side walls of the cavities created in the photoresist layer may not cleanly separate. In some cases, the excess metal may carry with it metal which was intended to be a part of the metal contact. Additionally, the excess metal may shear off such that a portion of the unneeded metal remains connected to the metal contact. In either case the metal contact may be unusable, thus rendering the entire device worthless and greatly increasing manufacturing costs.

It would therefore be highly desirable to have a means to provide a clean discontinuity of the deposited metal layer. While many skilled in the art have devised processing means to provide for a clean discontinuity, these prior art techniques add complexity to the fabrication process by requiring additional steps such as multiple electron beam radiation exposure. See, for example, U.S. Pat. No. 5,658,469. In general, this additional complexity tends to degrade overall process yields by adding a further source of variability. U.S. Pat. No. 5,468,595, which is incorporated herein by reference, shows an electron beam exposure technique wherein a photoresist is exposed at a controlled level, however, it does not describe use of a reflected electron beam bouncing upward, effectively re-exposing a part of the photoresist layer.

As part of a solution to the foregoing problems, a process has been found whereby the cavities of a photoresist image are expanded to include notches or wedge-shaped voids. These notches may then be filled with metal along with the cavities of the photoresist layer to form conductive attachments to the metal contacts. This results in metal contacts being more securely attached to the substrate. It has been found that during the shearing or metal lift-off step, the metal contacts remain substantially undamaged as a result of a stronger attachment to the substrate.

SUMMARY OF THE INVENTION

The invention provides a process for forming a photoresist image on a substrate which comprises:

a) depositing a photoresist onto a layer of a substrate;

b) imagewise exposing the photoresist to radiation and developing said photoresist to form at least one photoresist feature and thereby revealing portions of the layer;

c) etching away the revealed portions of the layer;

d) overall exposing the substrate, the at least one photoresist feature and remaining layer portions to sufficient electron beam radiation to render a part of the photoresist feature directly adjacent to the remaining layer portions more soluble in a developer than a balance of the photoresist feature; and e) partially developing the more soluble part of the photoresist feature to thereby expand the feature to form notches in the photoresist feature directly adjacent to the remaining layer portions.

The invention further provides a process for forming metal contacts on a substrate which comprises:

a) depositing a photoresist onto a layer of a substrate;
b) imagewise exposing the photoresist to radiation and developing said photoresist to form at least one photoresist feature and thereby revealing portions of the layer;
c) etching away the revealed portions of the layer;
d) overall exposing the substrate, the at least one photoresist feature and remaining layer portions to sufficient electron beam radiation to render a part of the photoresist feature directly adjacent to the remaining layer portions more soluble in a developer than a balance of the photoresist feature; and
e) partially developing the more soluble part of the photoresist feature to thereby expand the feature to form notches in the photoresist feature directly adjacent to the remaining layer portions;
f) depositing a metal into said notches to thereby form a conductive attachment to said metal contacts; and
g) removing the remaining photoresist and any metal which is not attachment-forming to the metal contacts on the substrate.

The invention also provides a microelectronic device prepared by a process which comprises:

a) depositing a photoresist onto a layer of a substrate;
b) imagewise exposing the photoresist to radiation and developing said photoresist to form at least one photoresist feature and thereby revealing portions of the layer;
c) etching away the revealed portions of the layer;
d) overall exposing the substrate, the at least one photoresist feature and remaining layer portions to sufficient electron beam radiation to render a part of the photoresist feature directly adjacent to the remaining layer portions more soluble in a developer than a balance of the photoresist feature; and
e) partially developing the more soluble part of the photoresist feature to thereby expand the feature to form notches in the photoresist feature directly adjacent to the remaining layer portions;
f) depositing a metal into said notches to thereby form a conductive attachment to said contacts; and
g) removing the remaining photoresist and any metal which is not attachment-forming to the metal contacts on the substrate.

DETAILED DESCRIPTION OF THE PREFERRED EMBODIMENT

According to the invention, a photoresist layer is first formed onto a layer such as a metal layer which is on a substrate. The metal layer is coated with a positive acting photoresist composition to form a photoresist layer. The photoresist layer is then imagewise exposed to actinic radiation and developed to form a plurality of cavities through the photoresist thus defining photoresist features and thereby revealing portions of the metal layer. The revealed portions of the metal layer are then etched away. Next, the substrate, remaining photoresist layer and remaining metal layer portions are overall exposed to sufficient electron beam radiation to render a part of the photoresist layer directly adjacent to the metal layer more soluble in a developer than the balance of the photoresist layer. Finally the more soluble part of the photoresist layer is partially developed to thereby expand the cavities to from notches in the photoresist layer directly adjacent to the metal layer.

A process for forming metal contacts is also disclosed as part of the invention. After forming the photoresist image as described above, metal is deposited into the cavities and notches to thereby form a conductive attachment to the metal contacts. Finally, the remaining photoresist and any metal which is not attachment-forming is removed such that the metal contacts remaining on the substrate are substantially undamaged.

Photoresist compositions are themselves well known in the art and are widely commercially available. Positive working photoresists include compositions or polymers that can be solubilized or degraded as a result of irradiation with an electron beam or actinic radiation. Suitable photoresist compositions may include mixtures of o-quinone diazides with an aqueous alkali soluble or swellable binder resin such as a novolak or poly(4-hydroxystyrene). Suitable photoresists are described in U.S. Pat. Nos. 4,692,398; 4,835,086; 4,863,827 and 4,892,801. Suitable photoresists may be purchased commercially as AZ-4620, from Clariant Corporation of Somerville, N.J. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(MMA-MAA) (poly methyl methacrylate-methacrylic acid); PMMA/P(MMA-MAA) polymethylmethacrylate/(poly methyl methacrylate-methacrylic acid). The photoresist of the present invention may comprise any of these materials or analogous materials provided different the composition can be solubilized or degraded as a result of irradiation with an electron beam or actinic radiation.

In a preferred embodiment, the positive working photoresist composition preferably comprises a solution of a novolak resin, a quinone diazide photosensitizer, and a compatible solvent composition. The production of novolak resins is well known in the art and is more fully described in U.S. Pat. No. 4,692,398. Suitable quinone diazide photosensitizers include o-quinone diazides such as naphthoquinone diazide sensitizers which are conventionally used in the art in positive photoresist formulations. Useful naphthoquinone diazide sensitizers include naphthoquinone-(1,2)-diazide-5-sulfonyl chloride, and naphtoquinone-(1,2)-diazide-4-sulfonyl chloride condensed with phenolic compounds such as hydroxy berzophenones. These compounds are also more fully described in U.S. Pat. No. 4,692,398.

To produce this preferred photoresist composition, the resin and diazide components are first mixed together with a suitable solvent. The resin component of this mixture is present in an amount of from about 15% to about 99% of the solid parts mixture, and the quinone is present in an amount of from about 1% to about 85% of the solid parts of the mixture. This resin/diazide mixture is then mixed with a solvent composition. The solvent composition may comprise any suitable solvent known in the art. Preferred solvents include propylene glycol monomethylether, propylene glycol monomethylether acetate, xylene, butyl acetate and Cellosolve acetate such that the solvent comprises from about 40% to about 90% by weight of the overall resist composition. Conventional photoresist additives such as dyes, anti-striation agents, plasticizers, adhesion promoters, speed enhancers and non-ionic surfactants may optionally be added to the photoresist composition before it is deposited onto the substrate.

A second preferred positive working photoresist composition preferably comprises an acrylic polymer such as polymethyl methacrylate (PMMA) and those mentioned above. Polymethyl methacrylate is an acrylic polymer which is extensively used in the industry. Polymethyl methacrylate is known for its clarity, surface hardness, UV resistance and generally good weatherability and chemical resistance. PMMA is commonly used as component of a resist in photolithographic processes for the fabrication of integrated circuits. PMMA is readily commercially available from Aldrich Chemical Company of Milwaukee, Wis.

Suitable developers for novolak resin/diazide photoresist are aqueous alkaline solutions. Typical examples of the aqueous alkaline solutions suitable as the developer include sodium hydroxide, tetramethylammonium hydroxide, or aqueous solutions of hydroxides of metals belonging to the groups I and II of the periodic table such as potassium hydroxide or an aqueous solution of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) can be used as the developer. Furthermore, if desired, the aqueous basic solution used as the developer may additionally contain any additives such as a surface active agent in order to improve the resulting development effect. Examples of an aqueous alkaline developer include AZ 400K alkaline developer or AZ 312 MIF alkaline developer available from Clariant Corporation of Somerville, N.J. Suitable developer for acrylate photoresists such as PMMA photoresists include methylisobutyl ketone and xylene.

Figure 1:
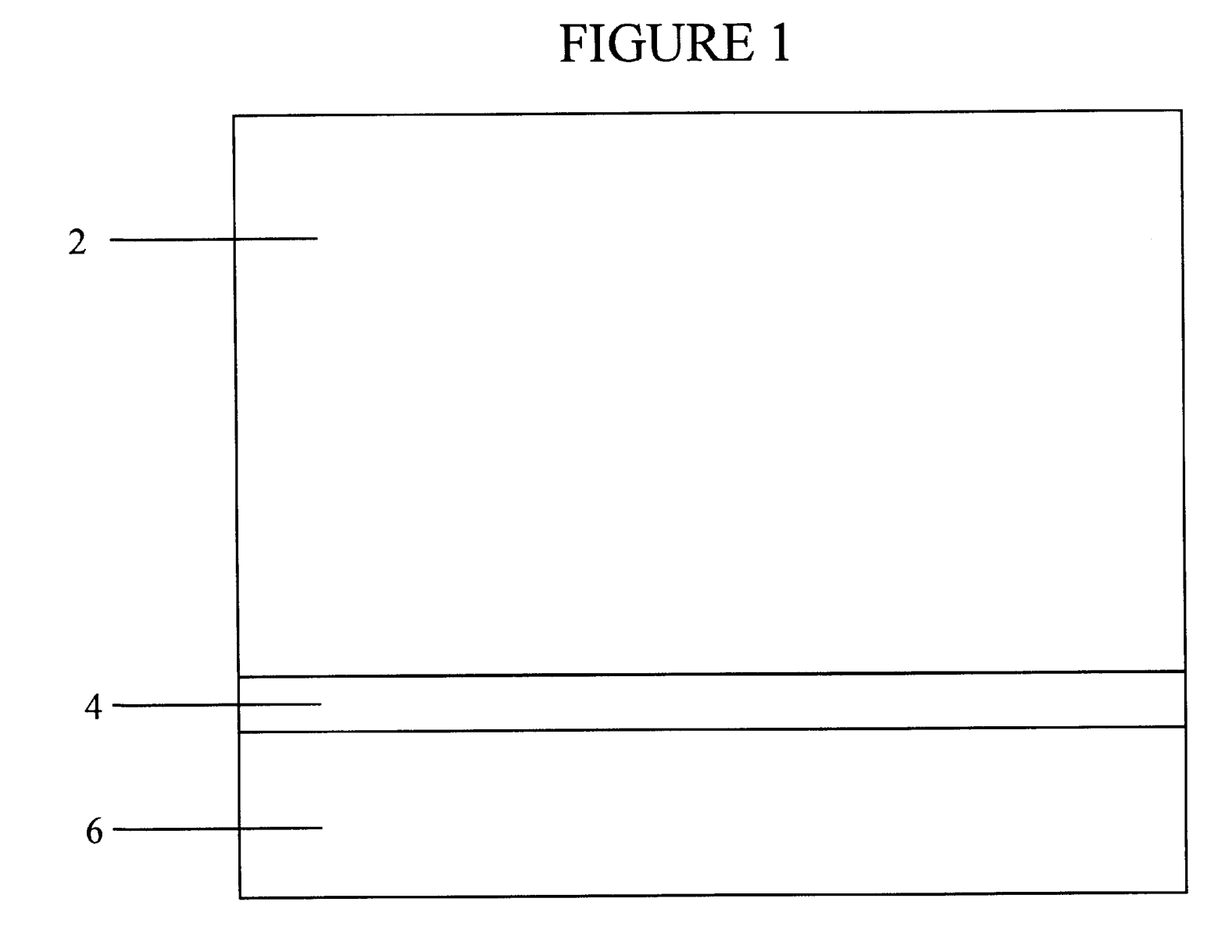
FIG. 1 shows a schematic view of the initial layers of photoresist, metal layer and substrate in relation to each other.

As shown in FIG. 1 of the present invention, the photoresist composition is deposited onto a metal layer 4 which is covering a suitable substrate 6 to thereby form a photoresist layer 2. Deposition maybe conducted via conventional spin-coating, dip coating, roller coating, spraying, chemical vapor deposition methods, or meniscus coating methods which are well-known in the art. Spin coating is most preferred. In a preferred embodiment of the invention, the photoresist layer 2 is formed by centrally applying a liquid photoresist composition to the upper surface of the metal film 4 and then spinning the substrate 6 on a rotating wheel (not shown) at speeds ranging from about 500 to about 6000 rpm, preferably from about 1500 to about 4000 rpm, for about 5 to about 60 seconds, preferably from about 10 to about 30 seconds, in order to spread the composition evenly across the upper surface. This photoresist composition is then dried and/or cured by conventional means such as hotplate softbaking to form the photoresist layer 2 on the metal layer 4.

The thickness of the photoresist layer may vary depending on the amount of liquid photoresist composition that is applied, but typically the thickness may range from about 500 Å to about 50,000 Å, and preferably from about 2000 Å to about 12000 Å. The amount of photoresist composition which is applied may vary from about 1 ml to about 10 ml, and preferably from about 2 ml to about 8 ml depending on the size of the substrate.

Typical substrates include those suitable to be processed into an integrated circuit or other microelectronic device. Suitable substrates for the present invention non-exclusively include semiconductor materials such as gallium arsenide (GaAs), germanium, lithium niobate ($LiNb_3$), silicon and compositions containing silicon such as crystalline silicon, polysilicon, amorphous silicon, epitaxial silicon, and silicon dioxide ($SiO_2$) and mixtures thereof. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The metal layer 4 may be a layer of aluminum, copper, tantalum, tungsten or mixtures thereof. The thickness of the metal film may vary depending on the metal used, manner the metal is applied to the substrate, etc.

After deposition onto the metal layer 4, the photoresist layer 2 is imagewise exposed, such as through a mask, to actinic radiation. This exposure renders the photoresist layer 2 more soluble after exposure than prior to exposure. The amount of actinic radiation used is an amount sufficient to render the exposed portions of the photoresist layer imagewise soluble in a suitable developer. Actinic radiation such as UV (ultraviolet), laser, writing e-beam, x radiation, etc., may be employed in the present invention. Preferably, UV radiation is used in an amount and at a wavelength sufficient to render the exposed portions of the photoresist layer imagewise soluble is a suitable developer. UV exposure doses of from about 100 $mJ/cm^2$ to about 300 $mJ/cm^2$ are usually sufficient.

Figure 2:
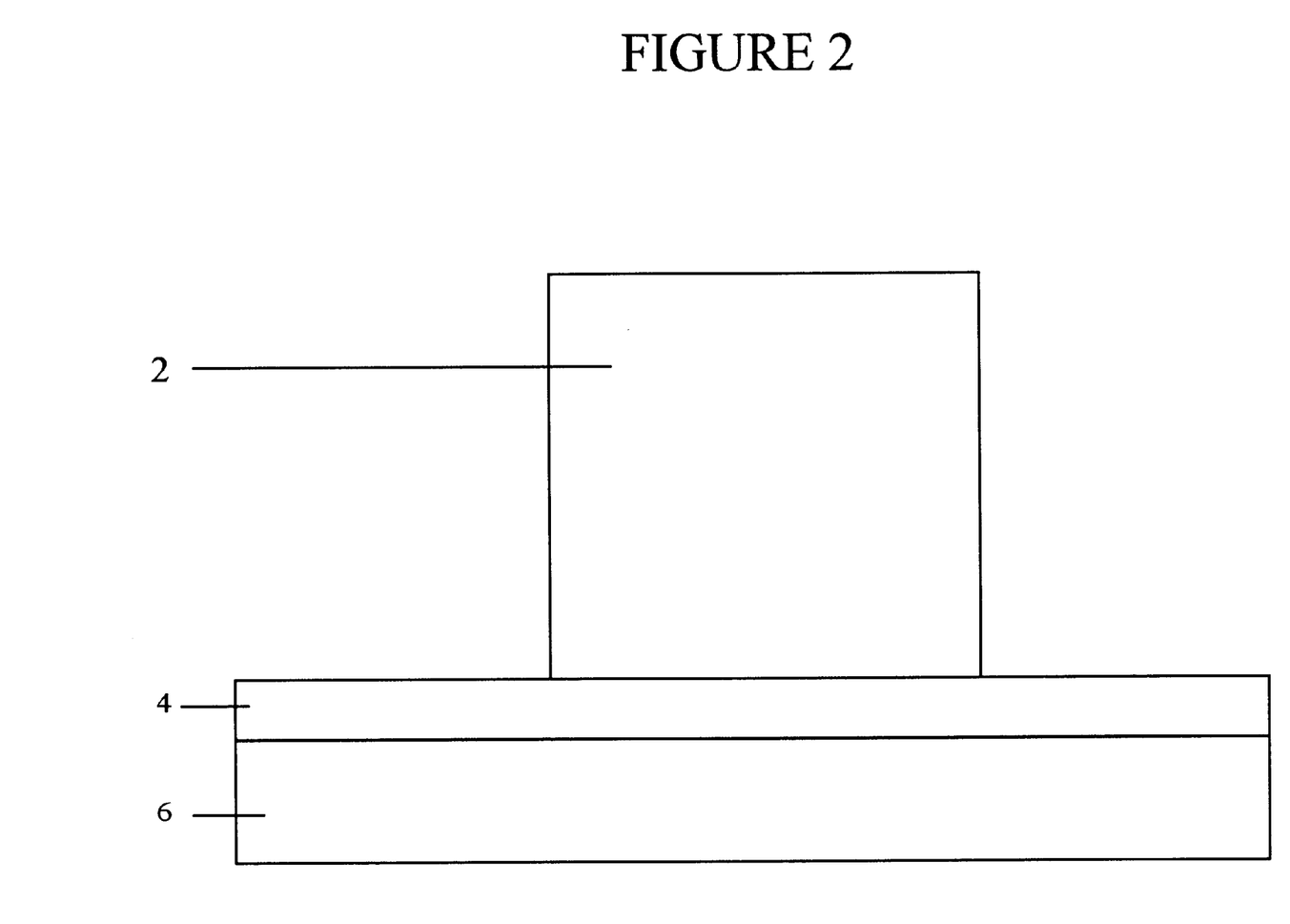
FIG. 2 shows a schematic view of the layers of photoresist, metal layer and substrate in relation to each other after having undergone imagewise exposure to actinic radiation and development.

Once the photoresist layer 2 has been exposed, it is developed under conditions sufficient to form a plurality of cavities. Some of the photoresist layer 2 remains, however, to form features as shown in FIG. 2. These cavities preferably extend through the photoresist layer 2 thereby revealing portions of the metal layer 4.

Figure 3:
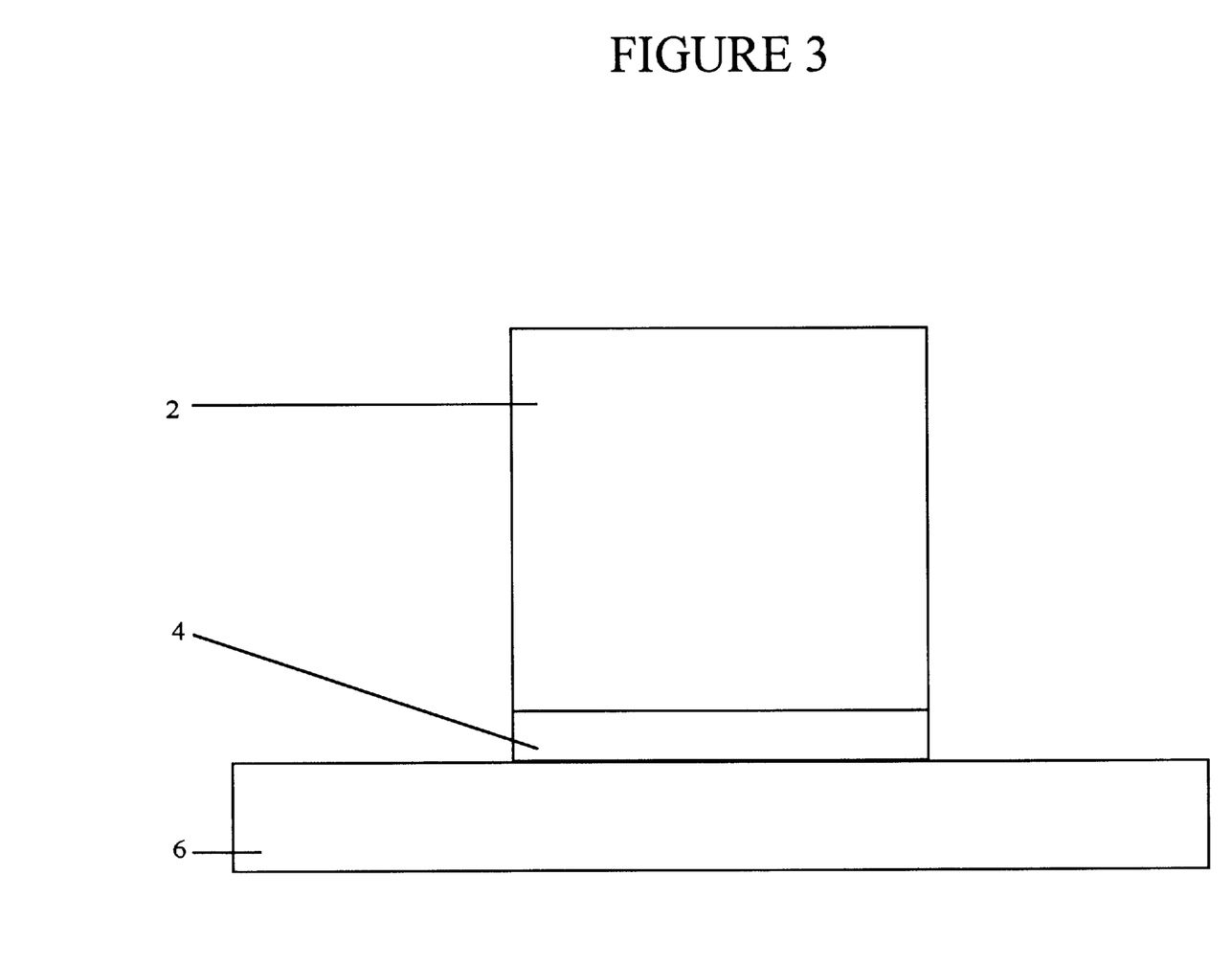
FIG. 3 shows a schematic view of the layers of photoresist, metal layer, and substrate in relation to each other after the revealed portions of the metal layer have been etched away.

Turning now to FIG. 3, the revealed portions of the metal layer 4 are etched away. This may be done by methods well known in the art. It is preferred, however, that the etching step is completed by either plasma etching or reactive ion etching techniques.

Figure 4:
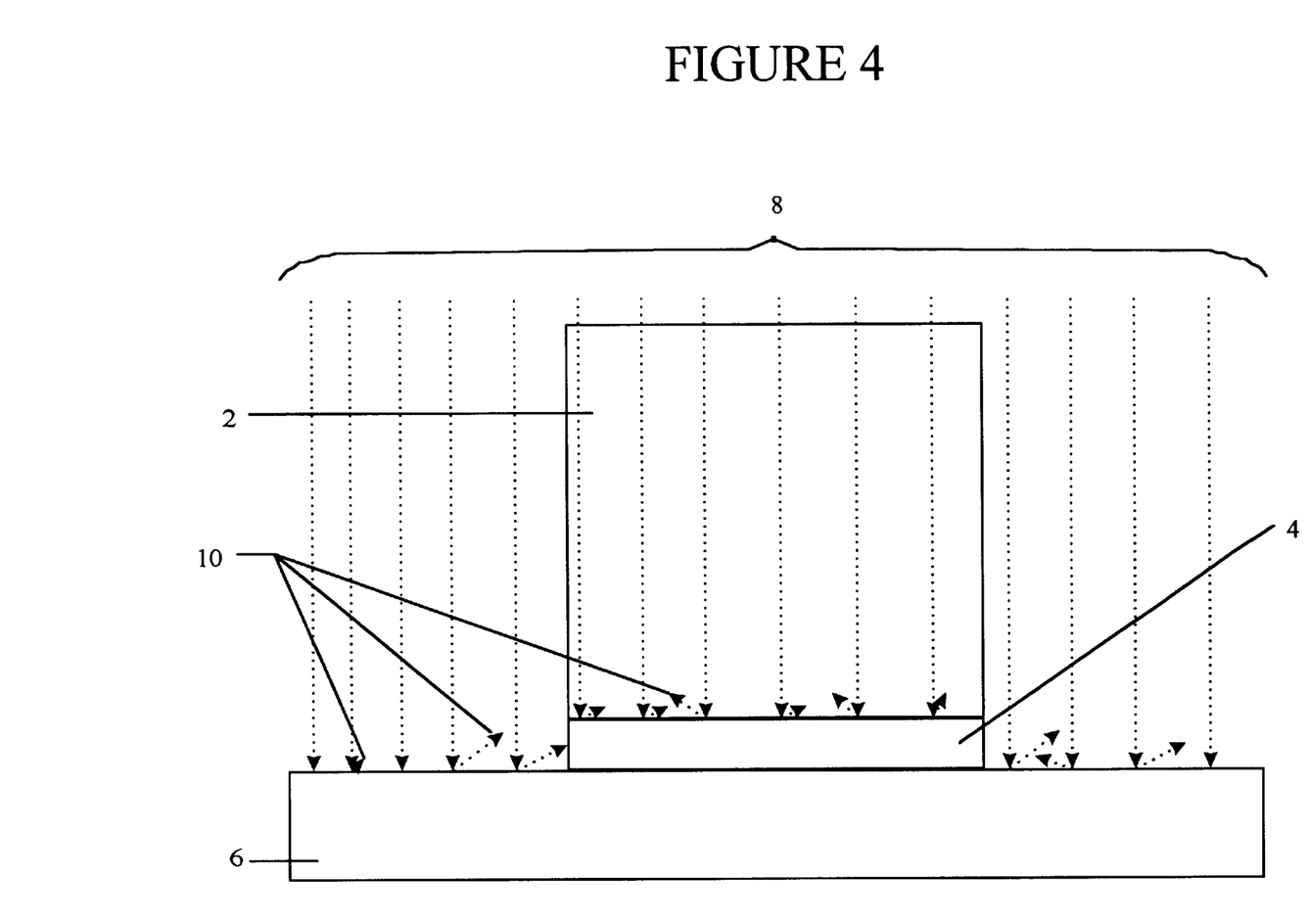
FIG. 4 shows a schematic of an electron beam flood exposure of the photoresist.
Figure 5:
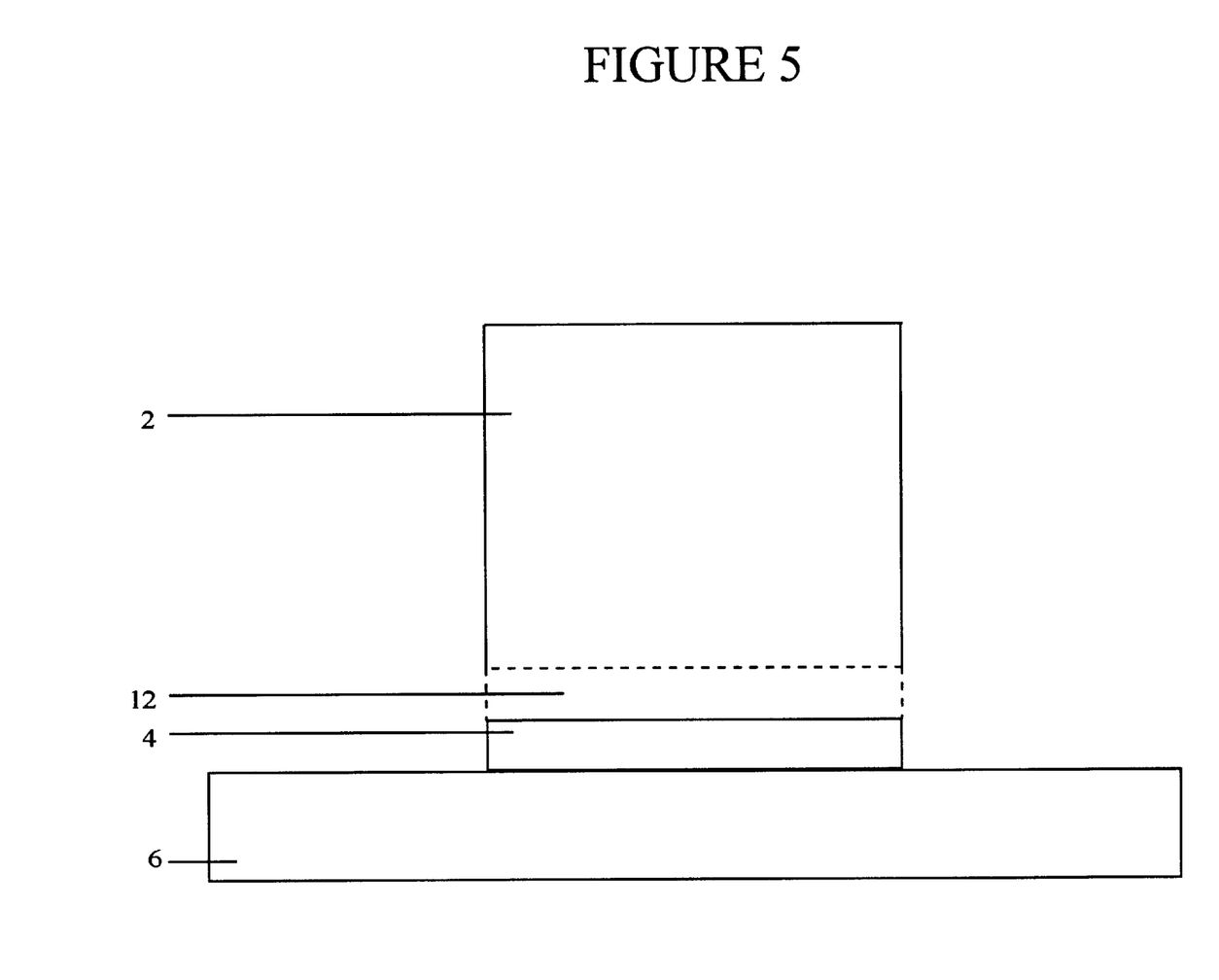
FIG. 5 shows a schematic of the layers of photoresist, soluble photoresist area, metal layer and substrate in relation to each other after electron beam flood exposure.

Turning now to FIG. 4, the remaining photoresist layer 2 in the form of a feature, metal layer 4 and the substrate 6 are then overall exposed to sufficient electron beam radiation 8 to render a part of the photoresist feature directly adjacent to the metal layer 4 more soluble in a developer than the balance of the photoresist layer. Electron beam exposure 8 may be controlled by setting the beam acceleration. The electron beam 8 is controlled such that the electrons reach all the way down to the substrate 6 or metal layer 4. It has been found that the electron beam bounces back or reflects off of the substrate 6 and the metal layer 4. The reflected electron beam 10 is shown bouncing upward, effectively re-exposing the photoresist layer directly adjacent to the metal layer 4. This "double exposure" of the photoresist layer adjacent to the metal layer 4 makes it more soluble than the rest of the photoresist feature which is effectively only exposed to a single exposure of electron beam radiation. Thus, only one overall exposure to electron beam radiation is used in order to obtain the desired photoresist image. FIG. 5 shows a soluble area 12 adjacent to a metal layer 4 after this "double exposure" to an electron beam.

Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of AlliedSignal Inc., under the trade name "Electron-Cure™". The principles of operation and performance characteristics of such device are described in U.S. Pat. No. 5,001,178, the disclosure of which is incorporated herein by reference. The temperature of the electron beam exposure preferably ranges from about 20° C. to about 450° C., more preferably from about 50° C. to about 400° C. The electron beam energy is preferably from about 1 to about 30 KeV, and more preferably from about 3 to about 10 KeV. The dose of electrons is from about 1 to about 50,000 $\mu C/cm^2$, preferably from about 50 to about 50,000 $\mu C/cm^2$ and more preferably from about 50 to about 20,000 $\mu C/cm^2$. The gas ambient in the electron beam tool can be any of the following gases: nitrogen, oxygen, hydrogen, argon, helium, ammonia, silane, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches. The end result of the electron beam treatment will be photoresist layers which are more soluble after exposure than prior to exposure.

Figure 6:
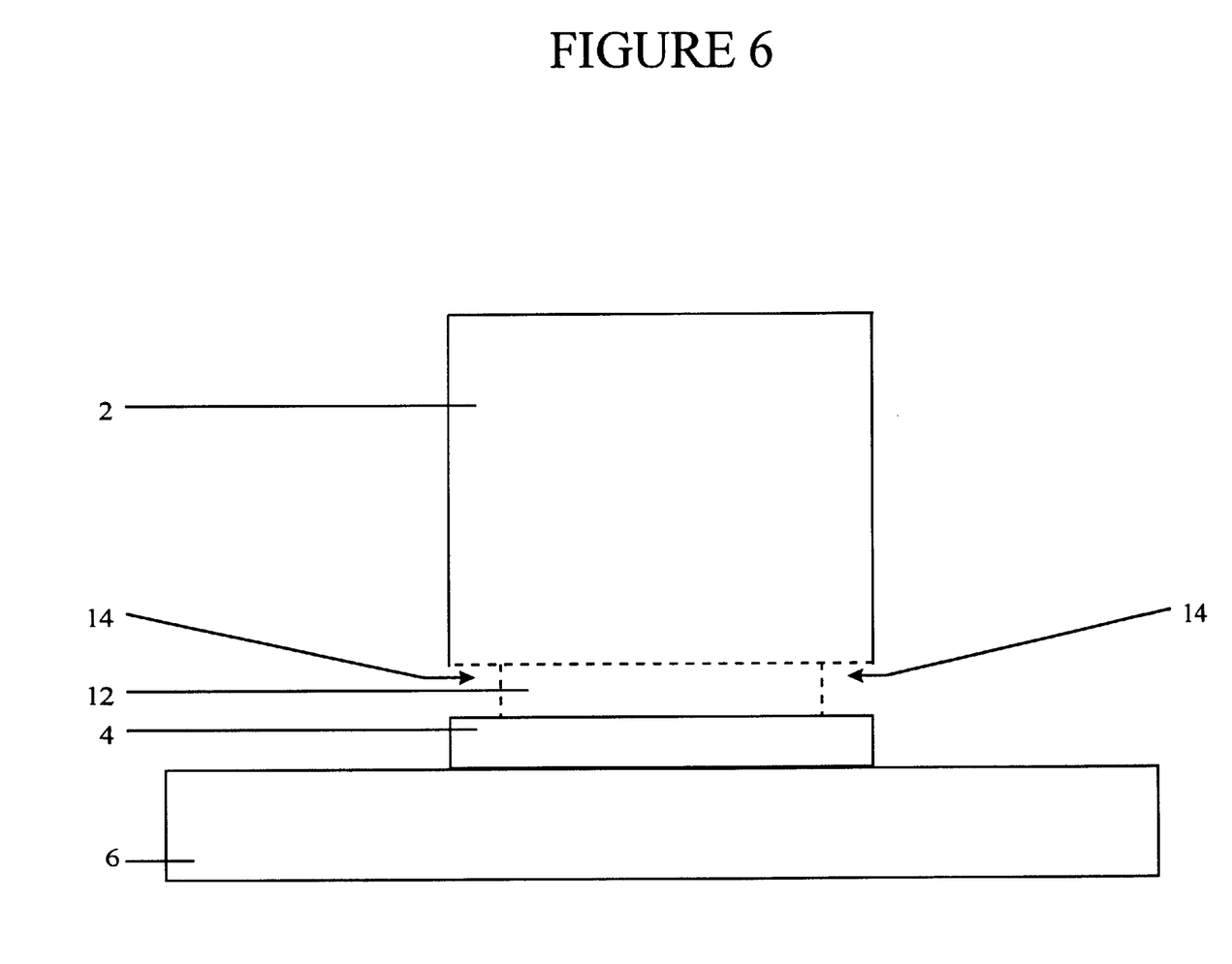
FIG. 6 shows a schematic of a notch created within the soluble photoresist layer which is created after partial development.

After election beam exposure, the photoresist feature 2 and its corresponding soluble layer 12 are partially developed. The development process occurs such that the soluble layer 12 is initially dissolved at the outer, exposed areas. The development continues until notches 14 of a desired dimension are created as shown in FIG. 6. The development procedure may comprise any conventional method such as immersion in the aforementioned developer and agitation with nitrogen bursts. Treatment of the soluble layer 12 of photoresist feature 2 with the developer causes removal of the doubly exposed areas and the creation of a notch in the photoresist. Once the notches 14 are of the desired dimensions, the development is stopped.

Figure 7:
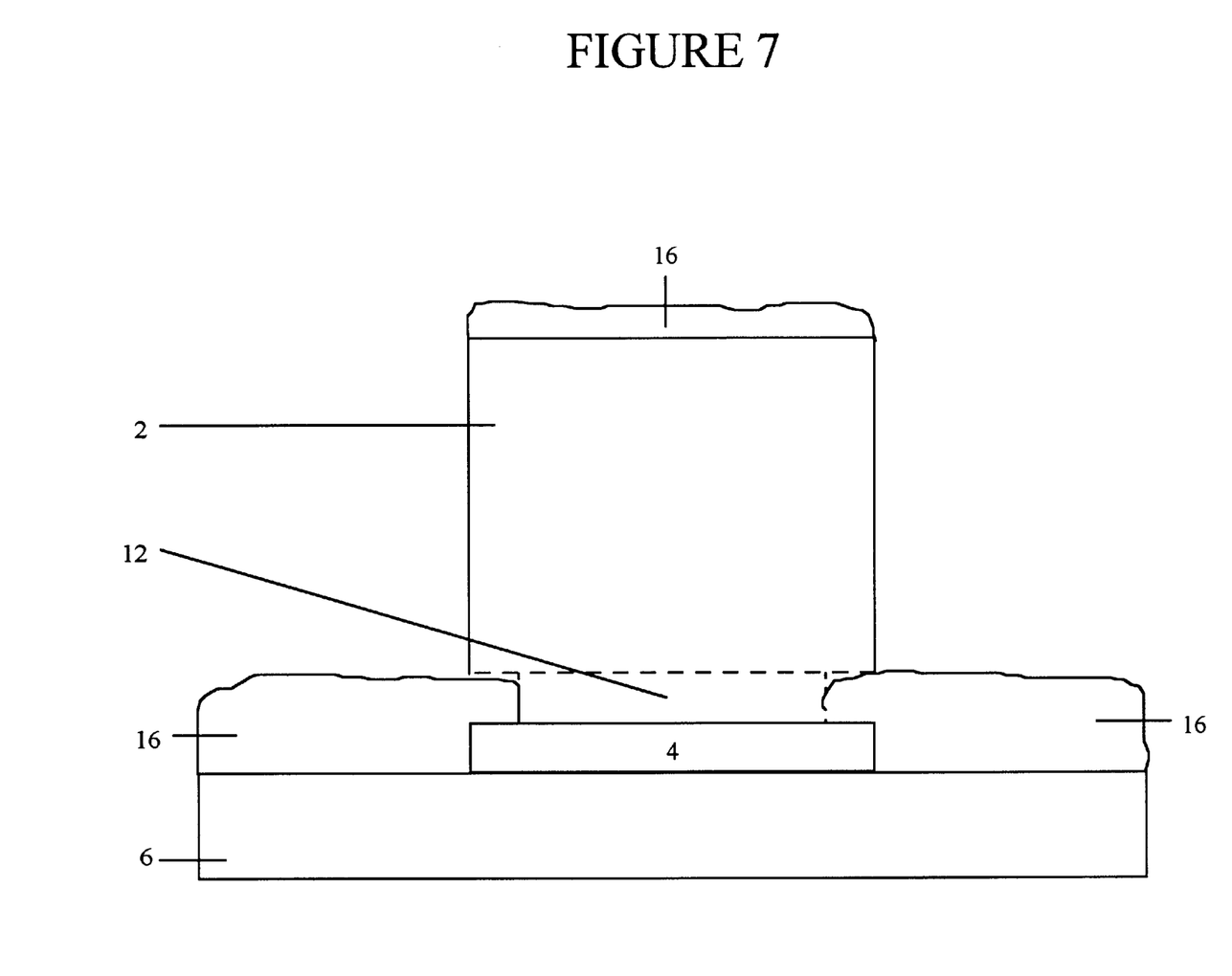
FIG. 7 shows a schematic of metal deposited into the cavities and notches of the photoresist.

In the formation of conductive attachments, a metal 16 is deposited onto the photoresist. As it is applied, the metal 16 fills in the notches 14 and the plurality of cavities surrounding the photoresist feature as shown in FIG. 7. Suitable metals include aluminum, aluminum alloys, copper, copper alloys, tantalum, tungsten, titanium or other metal typically employed in the formation of microelectronic devices. The metal may be applied by such techniques as vapor deposition, sputtering, evaporation and the like. The thickness of the metal layers is preferably from about 3,000 to 5,000 Angstroms. The metal 16 forms attachments to contacts 4 as shown.

Figure 8:
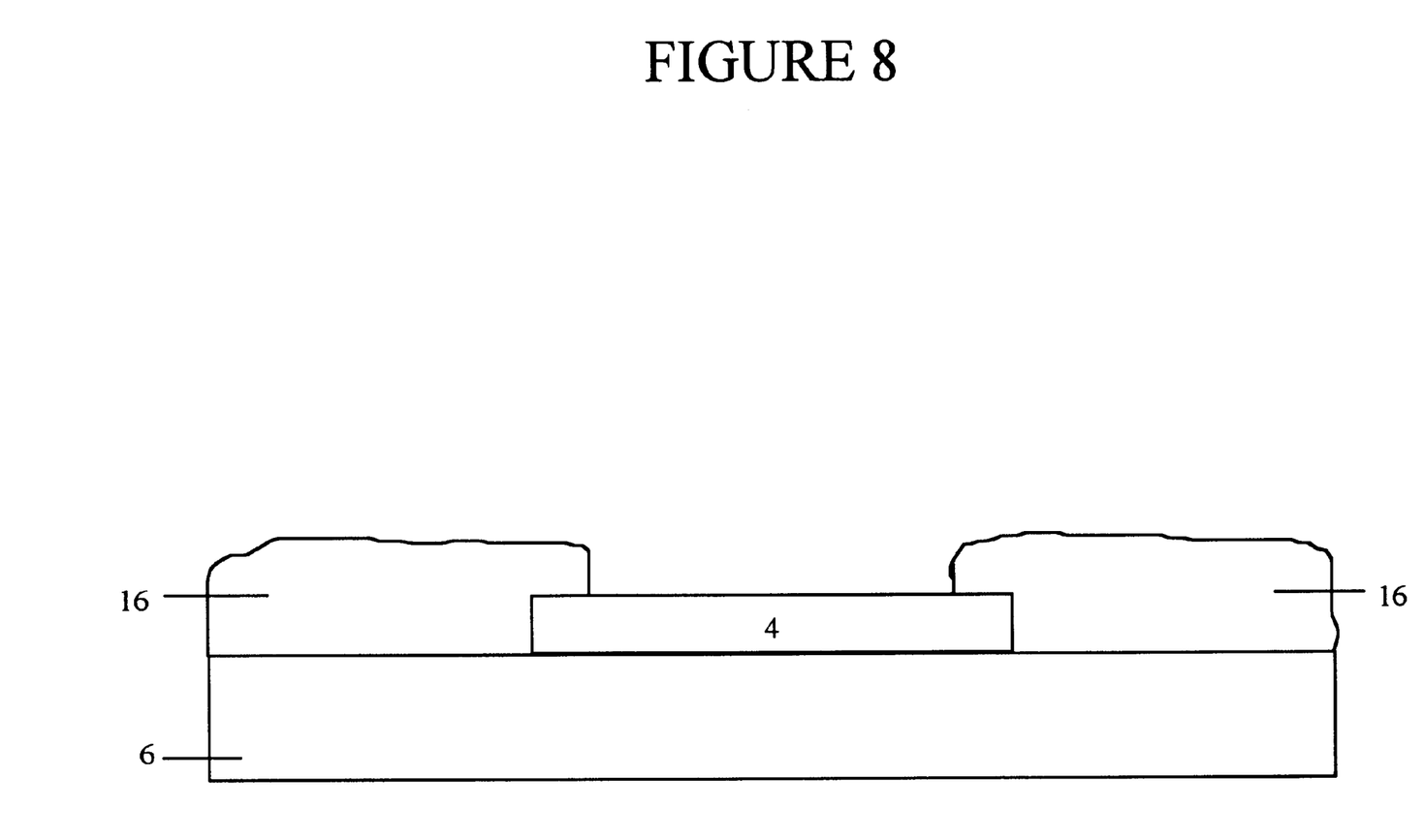
FIG. 8 shows a schematic of a metal contact, a conductive attachment, and substrate in relation to each other.

The remaining photoresist and any metal 16 which is not attachment-forming is then removed. This step is accomplished using techniques well known in the art. One technique includes stripping or lifting off the metal from the top photoresist surface. This technique may be carried out by soaking the overall construction in a solvent such as acetone resulting in the ability to shear off the balance of the metal on top of the photoresist in addition to simultaneously dissolving away the photoresist layer. It has been found that this process provides for a much stronger attachment of the metal contact at the desired location. As shown in FIG. 8, the result are metal contacts (the remains of the metal layer 4) remaining on the substrate 6 held firmly in place by conductive attachments 16.

The following non-limiting examples serve to illustrate the invention.

EXAMPLE 1

An initial conductive film was deposited to obtain 200 Å of NiFe on a silicon substrate. AZ1505 photoresist was spin coated at 3000 RPM to obtain a film thickness of 5,000 Å. Photoresist softbake was performed at 100° C. for 45 seconds. Imagewise photoresist exposure was done on a GCA XLS Model 7500 i-line stepper at 25 mJ using a clear field mask to produce isolated lines ranging in size from 2.0 $\mu$m down to 0.5 $\mu$m in width across the substrate with sidewall angles greater than 85°. The photoresist was developed for 180 seconds in AZ400K diluted 1:4 with DI water at 21° C. to remove the photoresist in the exposed regions. The metal film exposed during the photolithography process was removed from the exposed area using a Veeco Ion Mill. The resulting film stack included a photoresist feature on top of the metal film previously deposited. All metal was removed from the regions exposed during the photolithography process.

Using the Grun range($R_g$) calculation ($R_g$=(0.046/d) $V_a^{1.75}$ where d=photoresist density) for electrons traveling through photoresist, the acceleration voltage required for electrons to fully penetrate the photoresist was determined to be 5.0 keV. An additional 20%, for a total of 6.0 keV, was added to the previously determined acceleration voltage value to calculate the acceleration voltage needed to create a soluble region at the photoresistmetal interface. The additional acceleration voltage was necessary to completely penetrate the photoresist and allow sufficient electron backscatter from the deposited metal film to create a soluble region at the photoresist-substrate interface without creating solubility in the bulk of the photoresist bulk above the deposited metal film. This method of calculating the acceleration voltage necessary to properly expose only the photoresist at the photoresist-substrate interface eliminates the need for a second electron-beam flood cure of the photoresist bulk to prevent photoresist erosion that would occur during a subsequent development step. Electron beam flood exposure of the photoresist was done on the Electron Cure 30™ using 6.0 keV acceleration voltage at a dose of 10

μC/cm² with an electron beam current of 1 ma. A second photoresist development step was performed in AZ400K diluted 1:4 with DI water at 21° C. for 60 seconds to create a 1,000 Å by 1,000 Å notch profile in the photoresist.

EXAMPLE 2

TOK ip3250 photoresist was spin coated on LiNb₃ substrates at 4500 RPM to obtain a film thickness of 3,800 Å. Photoresist softbake was performed at 100° C. for 45 seconds. Photoresist exposure was done on a Cannon i-line stepper at 125 mJ using a dark field mask to produce isolated lines 0.5 μm in width with a 1.0 μm period. The photoresist was developed for 60 seconds in Shipley CD-26 developer at 21° C. to remove the photoresist in the exposed regions. Photoresist sidewall angles greater than 85° resulted. The resulting film stack included a photoresist feature on top of the LiNb3 substrate.

Using the Grun range($R_g$) calculation ($R_g$=(0.046/d) $V_a^{1.75}$ where d=photoresist density) for electrons traveling through photoresist, the acceleration voltage required for electrons to fully penetrate the photoresist was determined to be 5.0 keV. An additional 20%, for a total of 6.0 keV, was added to the previously determined acceleration voltage value to calculate the acceleration voltage needed to create a soluble region at the photoresistmetal interface. The additional acceleration voltage was necessary to completely penetrate the photoresist and allow sufficient electron backscatter from the substrate to create a soluble region at the photoresist-substrate interface without creating solubility in the bulk of the photoresist bulk. This method of calculating the acceleration voltage necessary to properly expose only the photoresist at the photoresist-substrate interface eliminates the need for a second electron-beam flood cure of the photoresist bulk to prevent photoresist erosion that would occur during a subsequent development step. EB flood exposure of the photoresist was done on the Electron Cure 30™ using 6.0 keV acceleration voltage at a dose of 10 μC/cm² with an electron beam current of 1 ma. A second photoresist development step was performed in Shipley CD-26 at 21° C. for 60 seconds to create a 500 Å by 500 Å notch profile in the photoresist.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have discussed above, and all equivalents thereto.

What is claimed is:

1. A process for forming a photoresist image on a substrate which comprises:
   a) depositing a photoresist onto a layer of a substrate;
   b) imagewise exposing the photoresist to radiation and developing said photoresist to form at least one photoresist feature and thereby revealing portions of the layer;
   c) etching away the revealed portions of the layer;
   d) overall exposing the substrate, the at least one photoresist feature and remaining layer portions to sufficient electron beam radiation to render a part of the photoresist feature directly adjacent to the remaining layer portions more soluble in a developer than a balance of the photoresist feature; and
   e) partially developing the more soluble part of the photoresist feature to thereby expand the feature to form notches in the photoresist feature directly adjacent to the remaining layer portions.

2. The process of claim 1 wherein the photoresist is positive working.

3. The process of claim 1 wherein the layer on the substrate comprises a metal.

4. The process of claim 1 wherein the photoresist comprises polymethylmethacrylate.

5. The process of claim 1 wherein the photoresist comprises a mixture of an o-quinone diazide with an aqueous alkali soluble or swellable binder resin.

6. The process of claim 1 wherein the substrate is selected from the group consisting of gallium arsenide (GaAs), germanium, lithium niobate, silicon, and mixtures thereof.

7. The process of claim 1 wherein the electron beam exposing step is conducted at an energy level ranging from about 1 to about 30 KeV.

8. The process of claim 1 wherein the electron beam exposing step is conducted at an electron dose ranging from about 1 to about 50,000 μC/cm².

9. The process of claim 1 wherein the electron beam exposing step is conducted with a wide, large beam of electron beam radiation from a large-area electron beam source.

10. The process of claim 1 wherein the electron beam exposing step is conducted with a wide, large beam of electron beam radiation from a uniform large-area electron beam source which covers an area of from about 4 square inches to about 256 square inches.

11. The process of claim 1 wherein the imagewise exposing is conducted with actinic radiation.

12. The process of claim 11 wherein the actinic radiation comprises ultraviolet, laser, writing e-beam, or x-radiation.

13. A process for forming metal contacts on a substrate which comprises:
   a) depositing a photoresist onto a layer of a substrate;
   b) imagewise exposing the photoresist to radiation and developing said photoresist to form at least one photoresist feature and thereby revealing portions of the layer;
   c) etching away the revealed portions of the layer;
   d) overall exposing the substrate, the at least one photoresist feature and remaining layer portions to sufficient electron beam radiation to render a part of the photoresist feature directly adjacent to the remaining layer portions more soluble in a developer than a balance of the photoresist feature; and
   e) partially developing the more soluble part of the photoresist feature to thereby expand the feature to form notches in the photoresist feature directly adjacent to the remaining layer portions;
   f) depositing a metal into said notches to thereby form a conductive attachment to said metal contacts; and
   g) removing the remaining photoresist and any metal which is not attachment-forming to the metal contacts on the substrate.

14. The process of claim 13 wherein the photoresist comprises polymethylmethacrylate.

15. The process of claim 13 wherein the photoresist comprises a mixture of an o-quinone diazide with an aqueous alkali soluble or swellable binder resin.

16. The process of claim 13 wherein the substrate is selected from the group consisting of gallium arsenide (GaAs), germanium, lithium niobate, silicon, and mixtures thereof.

17. The process of claim 13 wherein the electron beam exposing step is conducted at an energy level ranging from about 1 to about 30 KeV.

18. The process of claim 13 wherein the substrate has a metal film layer at a surface adjacent to the photoresist layer.

19. The process of claim 13 wherein the electron beam exposing step is conducted at an electron dose ranging from about 1 to about 50,000 $\mu C/cm^2$.

20. The process of claim 13 wherein the electron beam exposing step is conducted with a wide, large beam of electron beam radiation from a large-area electron beam source.

21. The process of claim 13 wherein the electron beam exposing step is conducted with a wide, large beam of electron beam radiation from a uniform large-area electron beam source which covers an area of from about 4 square inches to about 256 square inches.

22. The process of claim 13 wherein the imagewise exposing is conducted with actinic radiation.

23. The process of claim 22 wherein the actinic radiation comprises ultraviolet, laser, writing e-beam, or x-radiation.

24. The process of claim 13 wherein the metal is selected from the group consisting of aluminum, aluminum alloys, copper, copper alloys, tantalum, tungsten and titanium.

25. The process of claim 13 wherein the photoresist is positive working.

26. The process of claim 13 wherein the layer on the substrate comprises a metal.

27. A microelectronic device prepared by a process which comprises:

a) depositing a photoresist onto a layer of a substrate;

b) imagewise exposing the photoresist to radiation and developing said photoresist to form at least one photoresist feature and thereby revealing portions of the layer;

c) etching away the revealed portions of the layer;

d) overall exposing the substrate, the at least one photoresist feature and remaining layer portions to sufficient electron beam radiation to render a part of the photoresist feature directly adjacent to the remaining layer portions more soluble in a developer than a balance of the photoresist feature; and e) partially developing the more soluble part of the photoresist feature to thereby expand the feature to form notches in the photoresist feature directly adjacent to the remaining layer portions;

f) depositing a metal into said notches to thereby form a conductive attachment to said contacts; and g) removing the remaining photoresist and any metal which is not attachment-forming to the metal contacts on the substrate.

\* \* \* \* \*